United States Patent

Miya et al.

[11] Patent Number: 5,341,384
[45] Date of Patent: Aug. 23, 1994

[54] ERROR DETECTION METHOD USING CRC

[75] Inventors: Kazuyuki Miya, Machida; Osamu Kato; Kouichi Honma, both of Yokohama, all of Japan

[73] Assignee: Matsushita Electric Industrial Co., Ltd., Osaka, Japan

[21] Appl. No.: 778,982

[22] PCT Filed: Mar. 28, 1991

[86] PCT No.: PCT/JP91/00408
§ 371 Date: Nov. 12, 1991
§ 102(e) Date: Nov. 12, 1991

[87] PCT Pub. No.: WO91/15901
PCT Pub. Date: Oct. 17, 1991

[30] Foreign Application Priority Data
Apr. 2, 1990 [JP]  Japan .................................. 2-087914

[51] Int. Cl.$^5$ .............................................. G06F 11/10
[52] U.S. Cl. .............................................. 371/31; 371/30; 371/40.1; 371/40.3
[58] Field of Search ................. 371/31, 37.1, 30, 37.7, 371/40.1, 40.3, 37.2; 381/31

[56] References Cited

U.S. PATENT DOCUMENTS

| | | | |
|---|---|---|---|
| 4,604,657 | 8/1986 | Fukami et al. | 360/32 |
| 4,799,221 | 1/1989 | Fukami et al. | 371/40.2 |
| 4,831,624 | 5/1989 | McLaughlin et al. | 371/37.1 |
| 4,943,964 | 7/1990 | Hatanaka et al. | 371/31 |
| 5,097,507 | 3/1992 | Zinser et al. | 371/31 |
| 5,136,592 | 8/1992 | Weng | 371/37.1 |
| 5,148,431 | 9/1992 | Hayashi | 371/30 |
| 5,163,053 | 11/1992 | Okumura et al. | 371/31 |

FOREIGN PATENT DOCUMENTS 57-168543 10/1982 Japan .
63-298777 12/1988 Japan .

OTHER PUBLICATIONS

Hideki Imai, "Theory of Codes", pp. 106 and 107, Electronics Information Communication Committee.

*Primary Examiner*—Hoa T. Nguyen
*Attorney, Agent, or Firm*—Stevens, Davis, Miller & Mosher

[57] ABSTRACT

An error detection method used for digital communication which intends to reduce the probability of outputting the speech obtained by decoding the data that includes an error. The speech data encoded in an error detection code and an error correction code is transmitted. On a receiving side, the data with an error detected in either one of decoding of the error correction code and CRC checking is interpolated so that it is possible to prevent the data which actually includes an error from being decoded into speech as it is.

8 Claims, 3 Drawing Sheets

ONE BCH (32,21) CODE

TWO GOLAY (23,12) CODES

ERROR DETECTION METHOD USING CRC

BACKGROUND OF THE INVENTION

1. Field of the Invention

The present invention relates to an error detection method which is applied to e.g. digital communication.

2. Description of the Related Art

FIG. 3 is a flowchart for explaining the prior art error detection. As seen from FIG. 3, on a transmission side, speech is inputted (Step 14) and the speech is encoded (Step 15). The information (a bits) thus obtained is supplemented with an error detection code CRC (cyclic redundancy check code) (b bits) (Step 16). The information of (a+b) bits is encoded with an error correction code (Step 17) to be transmitted as one frame data (Step 18).

On a receiving side, the above error correction code is decoded (Step 20) and subjected to a CRC checking (Step 21) to detect an error (Step 22). Data having no error detected in the checking is subjected to a speech decoding processing on the decoded data (Step 23). The data with some error bits detected is subjected to sound processing, such as interpolation, using a previous frame or muting in place of the above speech decoding (Step 24). Both outputs are synthesized to be outputted as speech (Step 25).

However, in the above prior art error detection method, the CRC cannot detect the error in the case where one or more error bits are included in (a+b) bits. Thus, the prior art error detection method cannot provide error detection with high accuracy.

For example, when assuming a generator polynomial G (x) represented by $$G(x) = 1 + x + x^2 + x^4 + x^5 + x^7$$

and assuming an error pattern represented by a polynomial $$e(x) = 1 + x^2 + x^8 + x^9$$

Then the above e(x) can be transformed into $$e(x) = (1 + x + x^2 + x^4 + x^5 + x^7)(1 + x + x^2).$$

In this case, e(x) can be divided by G(x) so that the CRC checking will detect e(x) as a correct pattern. Therefore, although the error as many as 4 (four) bits is included in (a+b) bits, the error detection cannot be made.

The present invention intends to solve the above conventional problem, and an object of the present invention is to provide an excellent error detection method which can surely detect the error for the data including the error pattern as mentioned above.

DISCLOSURE OF THE INVENTION

In order to attain the above object, a CRC and an error correction code are selected so as to satisfy the following condition $$Kmin \leq Mmax$$

where Kmin represents the minimum value of the number of bits which may be overlooked by the error detection code (CRC) although some error bits is included in (a+b) bits, and Mmax represents the error detection capability (the number of error bits which can be surely detected) of the error correction code. In the above case of $G(x) = 1 + x + x^2 + x^4 + x^5 + x^7$ Kmin=4 so that CRC is combined with the error correction code satisfying Mmax≦4. Further, the error detection in decoding the error correction code as well as the above CRC checking is given to the error detection method. If an error has been detected in decoding the error correction code or in the CRC checking, it is decided that an error is included in the above a bits. Thus, the corresponding frame including the a bits is interpolated or sound reproduced from the frame is muted. Thus, the probability of outputting the speech obtained by decoding data which includes the error can be greatly reduced.

The present invention has the following advantage in the construction described above. If an error is detected in decoding the error correction code, it is decided that the error is included in the a bits. Therefore, the error which cannot be detected by the CRC checking can be surely detected. Thus, in accordance with the present invention, the probability of outputting the speech obtained by decoding the data as it includes the error can be greatly reduced.

DESCRIPTION OF THE PREFERRED EMBODIMENT

Figure 1:
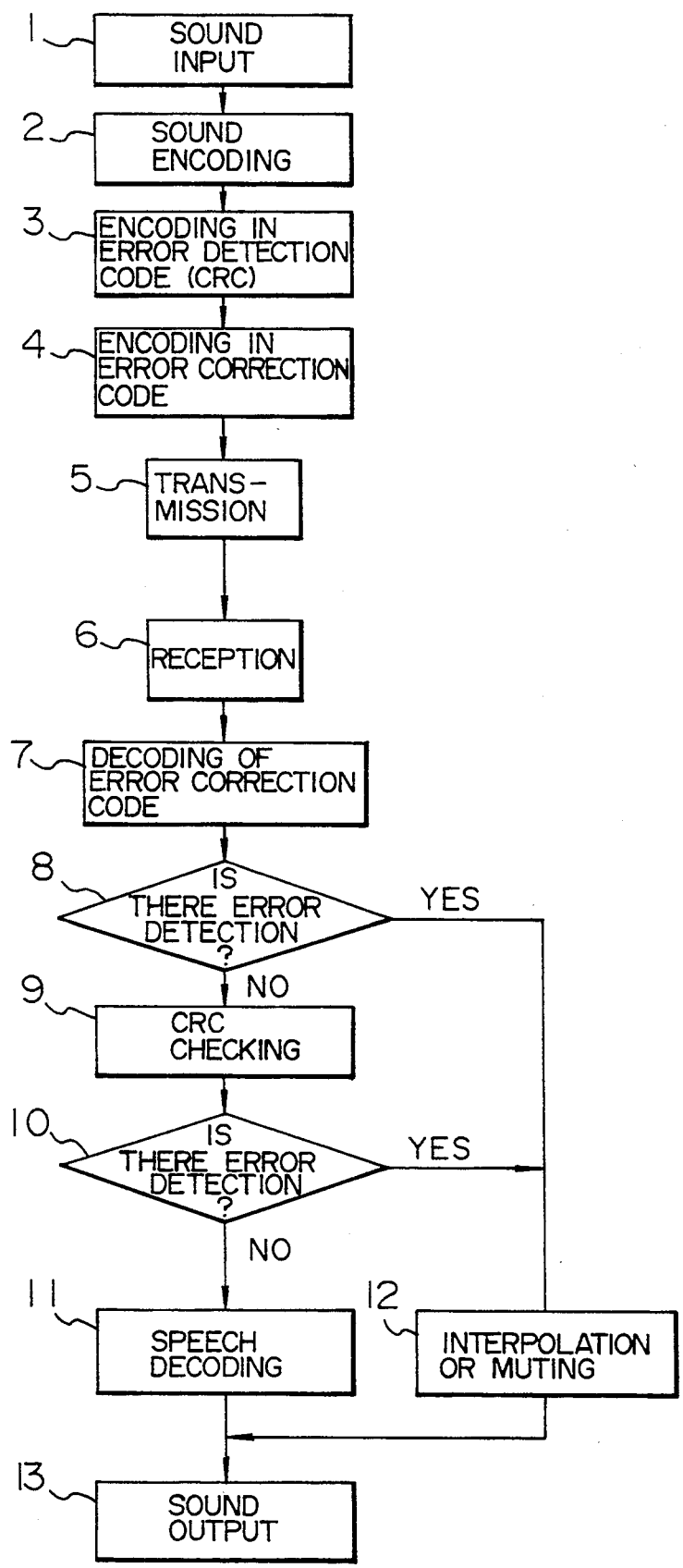
FIG. 1 is a flowchart for explaining the error detection method according to one embodiment of the present invention.

FIG. 1 is a flowchart in the case where the error detection method according to one embodiment of the present invention is applied to decoding of encoded speech data. As seen from FIG. 1, on a transmission side, speech is inputted (Step 1) and the speech is encoded (Step 2). The information (a bits) thus obtained is supplemented with an error detection code CRC (cyclic redundancy check code) (b bits) (Step 3). The information of (a+b) bits is encoded with an error correction code (Step 4) to be transmitted as one frame data (Step 5).

On a receiving side, in Step 7, error correction is made on the basis of decoding of the error correction code. In addition, in Step 8, error detection is made. If an error is detected in Step 8, it is decided that the data in the pertinent frame includes an error, and the data is subjected to interpolation processing using a previous frame and speech decoding. Then, the pertinent frame may be muted as the interpolation processing. The data with no error detected in Step 8 is subjected to the CRC checking (Step 9) to detect an error (Step 10). The data with no error detected in Step 10 is subjected to a speech decoding processing on the basis of the above decoded data (Step 11). The data with an error detected in the CRC checking in Step 10 is subjected to the interpolation processing and speech decoding (Step 12). Then, the pertinent frame may be muted as the interpolation processing.

Figure 2A:
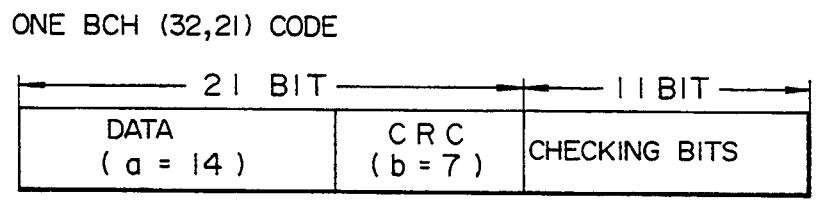
FIGS. 2A and 2B are views showing exemplary combinations of an error detection code (CRC) and an error correction code in the error detection method.
Figure 2B:
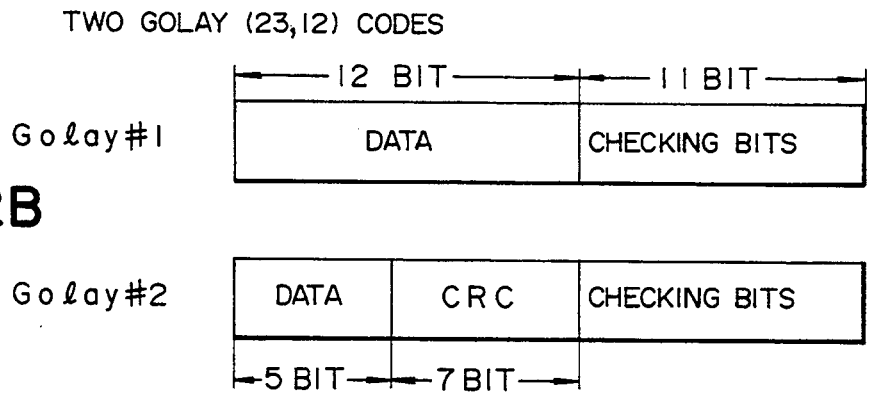
Figure 3:
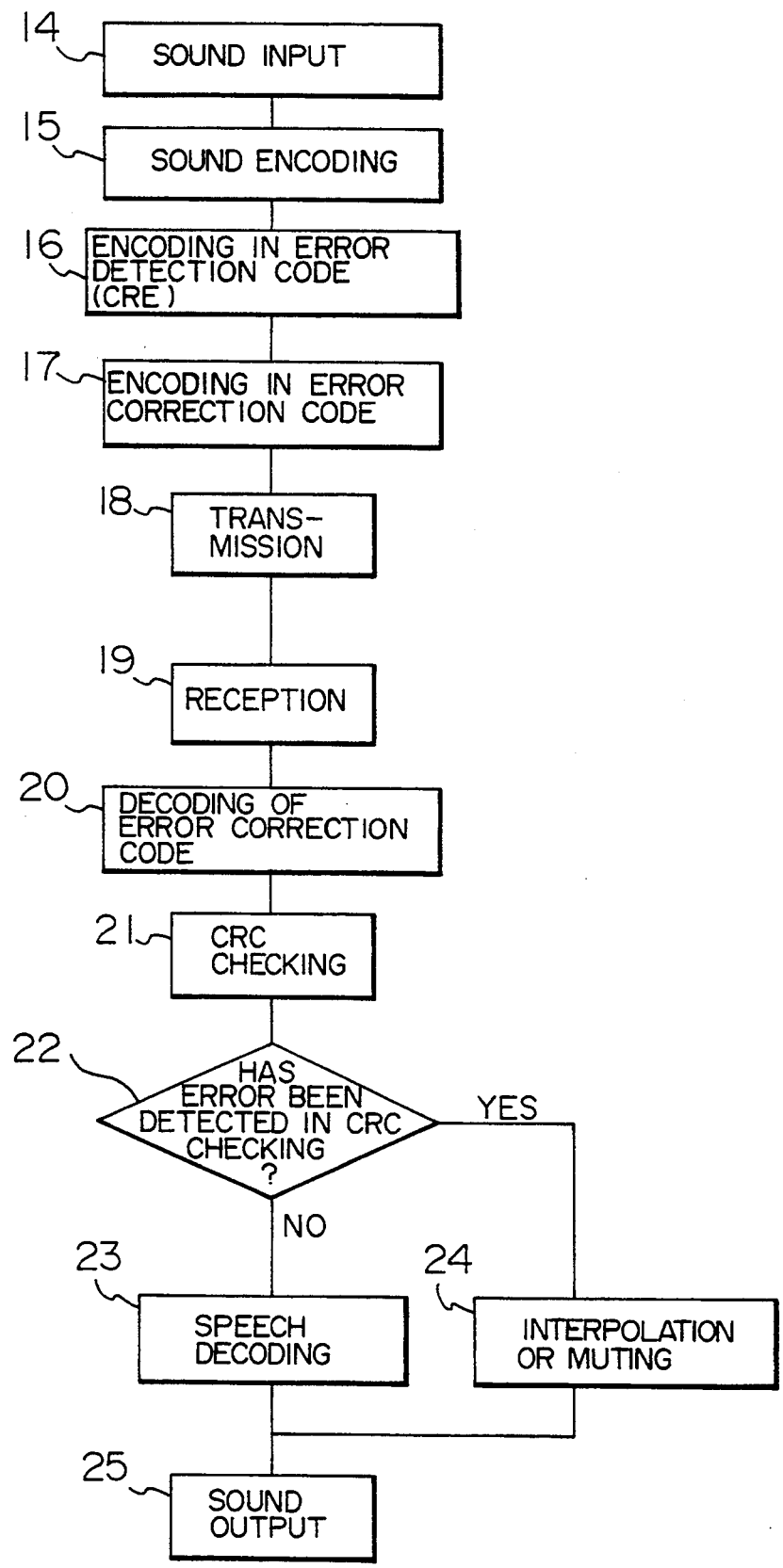
FIG. 3 is a flowchart for explaining the prior art error detection method.

FIGS. 2A and 2B show exemplary combinations of CRC and an error correction code according to the error detection method of the present invention. In both examples of FIGS. 2A and 2B, CRC is adopted as an error detection code in the above generator polynomial:

$$G(x) = 1 + x + x^2 + x^4 + x^5 + x^7$$

Kmin in this CRC is Kmin=4. In the example of FIG. 2A, the CRC is combined with a BCH (32, 21) code is used error correction code. If the BCH (32, 21) code is used to correct one error bit and detect 4 (four) error bits, Mmax=4 which satisfies the condition Kmin≦Mmax. In this case, the data of a=14 bits is supplemented with CRC of 7 (seven) bits. The information bits of 21 bits thus formed are supplemented with 11 (eleven) bits in the BCH (32, 21) code. Now if 4 error bits are included in the information bits of 21 bits, the BCH (32, 21 I) code can detect an error provided that the checking bits are correct. Therefore, the probability of overlooking error detection in the CRC checking can be reduced.

In the example of FIG. 2B, CRC is combined with two Golay (23, 12) codes. If the Golay (23, 12) codes are used to correct 2 (two) or less error bits and detect 4 (four) or less error bits, Mmax=4 which satisfies the above condition Kmin=Mmax. In the example of FIG. 2B, data of 17 bits (a=17) has a high possibility of generating code errors, As information bits, 12 bits of 17 bits of the data are given to the one Golay code (referred to as Golay #1) whereas the remaining 5 (five) bits and CRC 7 (seven) bits are given to another Golay code (referred to as Golay #2). Further, 11 bits as checking bits are given to each of the Golay codes. In the example of FIG. 2B, it is assumed that an error has been detected in Step 8 in decoding the Golay #1 or the Golay #2, and also 4 error bits are included in (a+b)=24 bits. In this case, if the error is included in only one of the Golay codes #1 or #2, it can be detected by the Golay code providing that the checking bits are correct. On the other hand, if the error is included on both Golay codes, Mmax=4 so that even if one or two error bits are included in the checking bits of each of the Golay codes, 4 or less error bits in 23 bits in each of the Golay codes can be surely corrected or detected.

In this way, in accordance with the above embodiment, if an error is detected in Step 8 of FIG. 1, the pertinent data is subjected to the interpolation processing using a previous frame without experiencing the CRC checking. The error which cannot be detected by the CRC checking can be surely removed with a strong probability.

The probability of outputting the speech obtained by decoding data that includes an error can be greatly reduced.

INDUSTRIAL APPLICABILITY

As apparent from the above embodiment, the present invention, which intends to execute error detection based on the error correction code as well as that based on the CRC, has an advantage that errors which cannot be detected by the CRC, can be surely detected. Thus, the probability of overlooking error detection can be sufficiently reduced so that the probability of outputting the speech obtained by decoding the data that includes an error can be greatly reduced.

We claim:

1. An error detection method comprising:
   (a) receiving data comprising speech data and a cyclic redundancy checking code (CRC) encoded in an error correction code;
   (b) decoding said data;
   (c) determining whether an error is included in the data decoded in step (b);
   (d) when step (c) determines that no error is included in the data decoded in step (b), performing a CRC-check on the data;
   (e) determining whether an error is included in the data which was CRC-checked in step (d);
   (f) when step (e) determines that no error is included in the data which was CRC-checked in step (d), decoding said data which was CRC-checked in step (d) into speech data;
   (g) when step (c) determines that an error is included in the data decoded in step (b), interpolating the data decoded in step (b) into first interpolated data and decoding the first interpolated data into first interpolated speech data; and
   (h) when step (e) determines that an error is included in the data which was CRC-checked in step (d), interpolating the data which was CRC-checked in step (d) into second interpolated data and decoding the second interpolated data into second interpolated second speech data.

2. An error detection method according to claim 1, wherein interpolation steps (g) and (h) are performed by muting.

3. An error detection method according to claim 1, wherein step (c) is performed in accordance with said CRC code included in said error correction code to yield a relationship Kmin≦Mmax between Kmin (minimum number of error bits which may be overlooked by CRC) and Mmax (maximum error detection capability of the error correction code).

4. An error detection method according to claim 3, wherein interpolation steps (g) and (h) are performed by muting the frame.

5. An error detection method comprising:
   (a) supplementing encoded speech data with a cyclic redundancy checking code (CRC);
   (b) encoding the data including said CRC into an error correction code to be transmitted;
   (c) transmitting said data encoded in step (b);
   (d) receiving the data transmitted in step (c) and decoding the received data;
   (e) determining whether an error is included in the data decoded in step (d);
   (f) when step (e) determines that no error is included in the data decoded in step (d), performing a CRC-check on the data;
   (g) determining whether an error is included in the data which was CRC-checked in step (f);
   (h) when step (g) determines that no error is included in the data which was CRC-checked in step (f), decoding said data into speech data;
   (i) when step (e) determines that an error is included in the data decoded in step (d), interpolating the data decoded in step (e) into first interpolated data and decoding the first interpolated data into first interpolated speech data; and
   (j) when step (g) determines that an error is included in the data which was CRC-checked in step (f), interpolating the data which was CRC-checked in step (f) into second interpolated data and decoding the second interpolated data into second interpolated speech data.

6. An error detection method according to claim 2, wherein interpolation steps (i) and (j) are performed by muting the frame.

7. An error detection method according to claim 5, wherein step (e) is performed in accordance with said CRC code included in said error correction code to yield a relationship Kmin≦Mmax between Kmin (minimum number of error bits which may be overlooked by CRC) and Mmax (maximum error detection capability of the error correction code).

8. An error detection method according to claim 7, wherein interpolation steps (i) and (j) are performed by muting.

* * * * *